(12) United States Patent
Boecker et al.

(10) Patent No.: US 11,646,724 B2
(45) Date of Patent: *May 9, 2023

(54) ADJUSTMENT OF MULTI-PHASE CLOCK SYSTEM

(71) Applicant: Rambus Inc., San Jose, CA (US)

(72) Inventors: Charles Walter Boecker, Ames, IA (US); Roxanne Vu, San Jose, CA (US); Eric Douglas Groen, Ankeny, IA (US)

(73) Assignee: Rambus Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/668,584

(22) Filed: Feb. 10, 2022

(65) Prior Publication Data

US 2022/0337232 A1  Oct. 20, 2022

Related U.S. Application Data

(63) Continuation of application No. 16/721,116, filed on Dec. 19, 2019, now Pat. No. 11,283,435.

(60) Provisional application No. 62/781,974, filed on Dec. 19, 2018.

(51) Int. Cl.
  *H03K 5/13* (2014.01)
  *H03K 3/356* (2006.01)
  *H03K 5/135* (2006.01)
  *H03K 5/00* (2006.01)

(52) U.S. Cl.
  CPC ......... *H03K 5/13* (2013.01); *H03K 3/356104* (2013.01); *H03K 5/135* (2013.01); *H03K 2005/00019* (2013.01)

(58) Field of Classification Search
  CPC .... H03K 5/13; H03K 3/356104; H03K 5/135; H03K 2005/00019
  See application file for complete search history.

(56) References Cited

U.S. PATENT DOCUMENTS

| | | | |
|---|---|---|---|
| 5,467,041 A * | 11/1995 | Baba | H03K 5/133 327/276 |
| 6,826,247 B1 | 11/2004 | Elliott et al. | |
| 7,443,941 B2 | 10/2008 | Farjad-rad | |
| 8,228,106 B2 | 7/2012 | Baumann et al. | |
| 2005/0246141 A1 | 11/2005 | Hsu et al. | |
| 2011/0169673 A1* | 7/2011 | Henzler | G04F 10/005 341/141 |
| 2012/0019262 A1 | 1/2012 | Zhang et al. | |
| 2018/0091159 A1 | 3/2018 | Tsutsumi et al. | |

* cited by examiner

*Primary Examiner* — John W Poos
(74) *Attorney, Agent, or Firm* — The Neudeck Law Firm, LLC

(57) ABSTRACT

Disclosed is a system where indicators of the relative phase differences between combinations of clocks in a multi-phase clock system are developed and/or measured. These indicators convey information regarding which phase difference between a given pair of the clocks is greater than (or less than) the phase difference between another pair of the clocks. This information is used to sort/rank/order phase differences between the various combinations of pairs of clocks according to their phase differences. This ranking is used to select the pair of clocks to be adjusted.

20 Claims, 9 Drawing Sheets

ADJUSTMENT OF MULTI-PHASE CLOCK SYSTEM

DETAILED DESCRIPTION OF THE EMBODIMENTS

Two phase clock systems, where two clocks pulse high and low for an equal amount of time and have a 180° phase difference relative to each other, are used in applications such as double data rate transmission. Multi-phase clock systems, however, may have three or more clocks with unequal amounts of high and low time. In addition, the phase differences between the clocks of a multi-phase clock system may or may not be uniformly distributed such that a given transition occurs at a multiple of 360°/N, where N is the number of clocks.

An example of a uniformly distributed three phase clock system may have the first clock transitioning high with a phase of 0° and low at 360°/3=120°; the second clock transitioning high with a phase of 120° and low at 240°; and, the third clock transitioning high at 240° and low at 0°. Thus, for example, the first clock is high for the first ⅓ of the overall cycle, and low for the last ⅔ of the overall cycle. Accordingly, equalizing the high time of the first clock with the low time of another clock (as may be done with a two phase system), will not result in a properly adjusted clock system.

In an embodiment, indicators of the relative phase differences between combinations of clocks in a multi-phase clock system are developed and/or measured. These indicators may convey information regarding which phase difference between a given pair of the clocks is greater than (or less than) the phase difference between another pair of the clocks. This is enough information for phase differences between the various combinations of pairs of clocks to be sorted/ranked/ordered according to their phase differences. This ranking may be used to select the pair of clocks to be adjusted.

For example, the phase difference between the pair of clocks with the greatest phase difference may be adjusted by decreasing the low time of the later of the two clocks of the pair. Likewise, the phase difference between the pair of clocks with the smallest phase difference may be adjusted by increasing the low time of the later of the two clocks of the pair. Other adjustments and/or search algorithms may be used to uniformly distribute the phase of the clocks. In another embodiment, the indicators may be biased or skewed before ranking in order to obtain a desired non-uniformly distributed phasing of the clocks.

Figure 1:
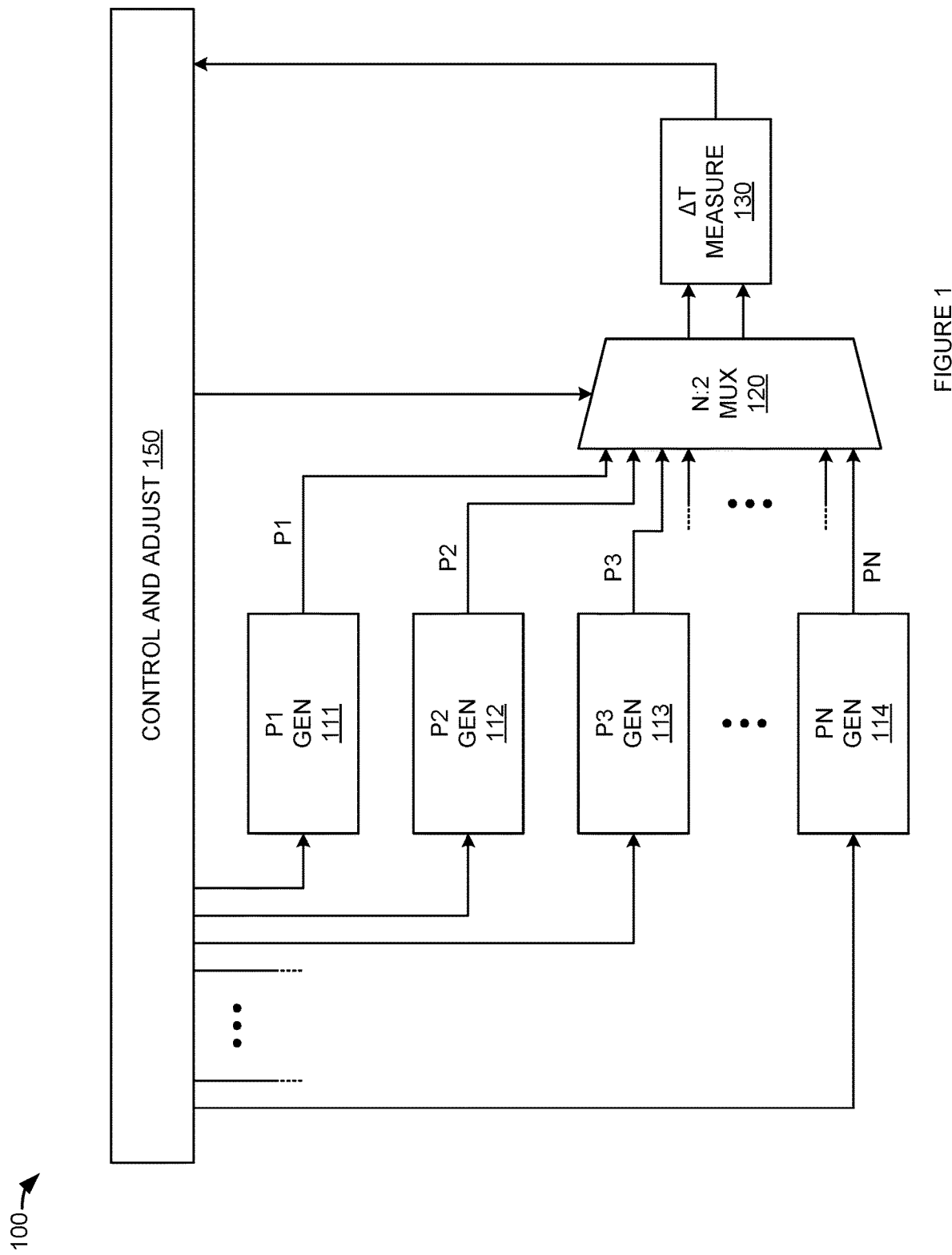
FIG. 1 is a block diagram illustrating a multi-phase clock adjustment system.

FIG. 1 is a block diagram illustrating a multi-phase clock adjustment system. In FIG. 1, multiphase clock adjustment system 100 comprises N number of clock phase generators 111-114, N-to-two signal (N:2) multiplexer (MUX) 120, time difference (ΔT) measurement circuitry 130, and control and adjust circuitry 150. The outputs, clock phase signals P1-PN, of clock phase generators 111-114 are operatively coupled to the inputs of N:2 MUX 120. Control and adjust circuitry 150 is operative coupled to the control input(s) of N:2 MUX 120. Thus, control and adjust circuitry 150 may control N:2 MUX 120 to select two of the signals P1-PN generated by clock phase generators 111-114. In particular, N:2 MUX 120 may select pairs of the clock phase signals P1-PN that correspond to adjacent clock phases.

Control and adjust circuitry 150 is operative coupled to control input(s) of clock phase generator 111-114. Thus, control and adjust circuitry 150 may control the timing of the rising and falling edges of clock phase signals P1-PN generated by clock phase generators 111-114. Control and adjust circuitry 150 may control the timing of the rising and/or falling edges of the clock phase signals P1-PN generated by clock phase generators 111-114 to uniformly distribute the N number of clock phase signals P1-PN over the cycle time of the clock phases. In an embodiment, control and adjust circuitry 150 may skew one or more of the clock phase signals P1-PN generated by clock phase generators 111-114 to obtain a desired nonuniform distribution of the clock phases signals P1-PN generated by clock phase generator 111-114.

The pair of clock phase signals P1-PN from the outputs of MUX 120 are provided to time difference measurement circuitry 130. Time measurement circuitry 130 measures an indicator of the time difference between selected edges of the pair of clock phase signals P1-PN from MUX 120. This indicator (and those from other measurements of other pairs of clock phase signal pairs) is provided to control and adjust circuitry 150. Control and adjust circuitry 150 adjusts the timing of one or more clock phase signals P1-PN generated by clock phase generators 111-114 based on one or more indicators received from time measurement circuitry 130.

In an embodiment, control and adjust circuitry 150 may adjust the timing of the clock phase signals P1-PN generated by clock phase generators 111-114 to uniformly distribute the N number of clock signals over the entire clock period of the clock phases. In other words, control and adjust circuitry 150 may adjust the spacing (i.e., phase angle of selected edges of adjacent phases) and the pulse width of the clock phase signals P1-PN generated by clock phase generators 111-114 such that the rising (or falling) edges of adjacent phases (e.g., phase P1 rising edge to phase P2 rising edge, phase P2 rising edge to phase P3 rising edge, etc.) are the same (or substantially the same).

Figure 2:
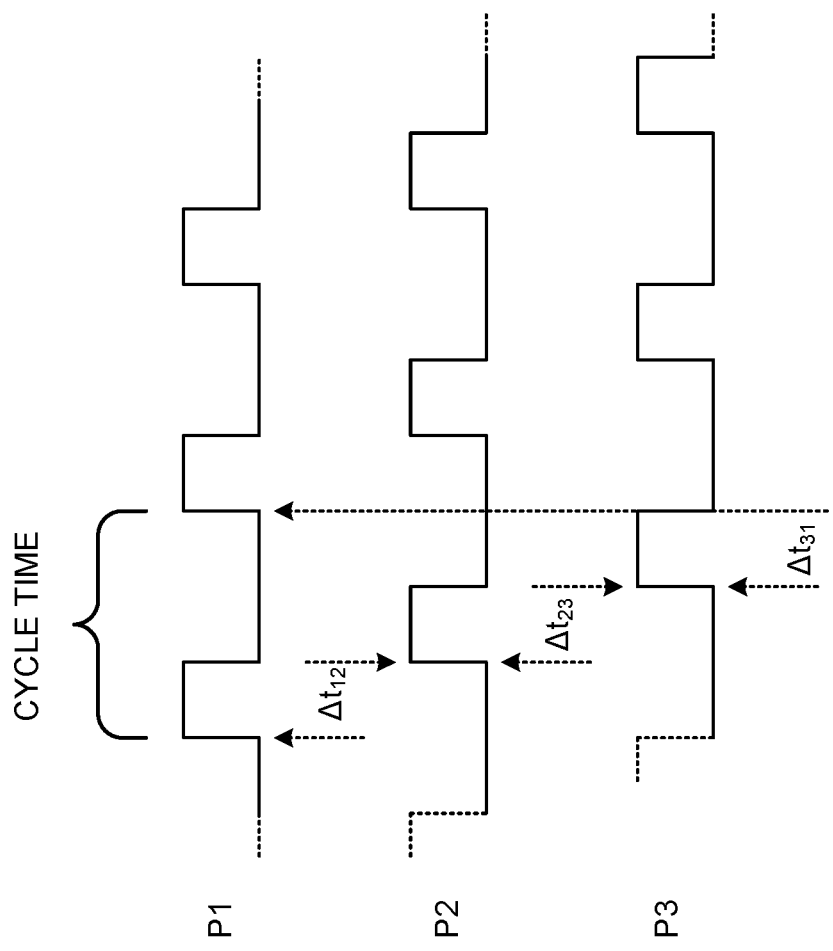
FIG. 2 is a timing diagram illustrating measurements for adjusting a multi-phase clock system.

This is further illustrated by way of example in FIG. 2. In FIG. 2, clock phase signals P1-P3 are illustrated. Thus, the clocking system illustrated in FIG. 2 is a 3-phase system. Clock phase signals P1-P3 each pulse once over the cycle time period. However, each of these pulses starts at a different, uniformly spaced, time during the cycle. Thus, in FIG. 2, P1 pulses high for ⅓ of a cycle time beginning at the start of a cycle; P2 pulses high for ⅓ of a cycle time beginning ⅓ of a cycle time from the start of a cycle; and, P3 pulses high for ⅓ of a cycle time beginning ⅔ of a cycle time from the start of a cycle.

To adjust clock phase signals P1-P3, system 100 uses N:2 MUX to select two signals at a time to be provided to time measurement circuitry 130. Time measurement circuitry 130 generates an indicator of the time difference between the two selected signals. This indicator is provided to control and adjust circuitry 150. This process is repeated for the other measurements control and adjust circuitry uses to adjust clock phase signals P1-P3.

As illustrated in FIG. 2, system 100 measures a first time difference indicator between the rising edges of P1 and P2 ($\Delta t_{12}$); a second time difference between the rising edges of P2 and P3 ($\Delta t_{23}$); and, a third time difference between the rising edge of P3 and the rising edge of the P1 pulse in the next cycle ($\Delta t_{31}$). These time difference indicators may be used by control and adjust circuitry 150 to adjust the timing of the rising and/or falling edges of clock phase signals P1-P3 generated by clock phase generators 111-114.

In an embodiment, control and adjust circuitry 150 may adjust the rising and falling edges of clock phases signals P1-PN such that rising edge of the next clock phase signal occurs substantially at the same time as the falling edge of the current clock phase signal. Control and adjust circuitry 150 may also adjust the difference of the time between the rising edge of a given clock phase signal P1-PN and the rising edge of the next clock phase signal. Control and adjust circuitry 150 may adjust the difference of the time between the rising edge of a given clock phase signal P1-PN and the rising edge of the next clock phase signal in order to equalize these time differences. These adjustments can result in a uniform distribution of the N number of clock phase signals P1-PN over the entire clock period of the clock phases.

Figure 3:
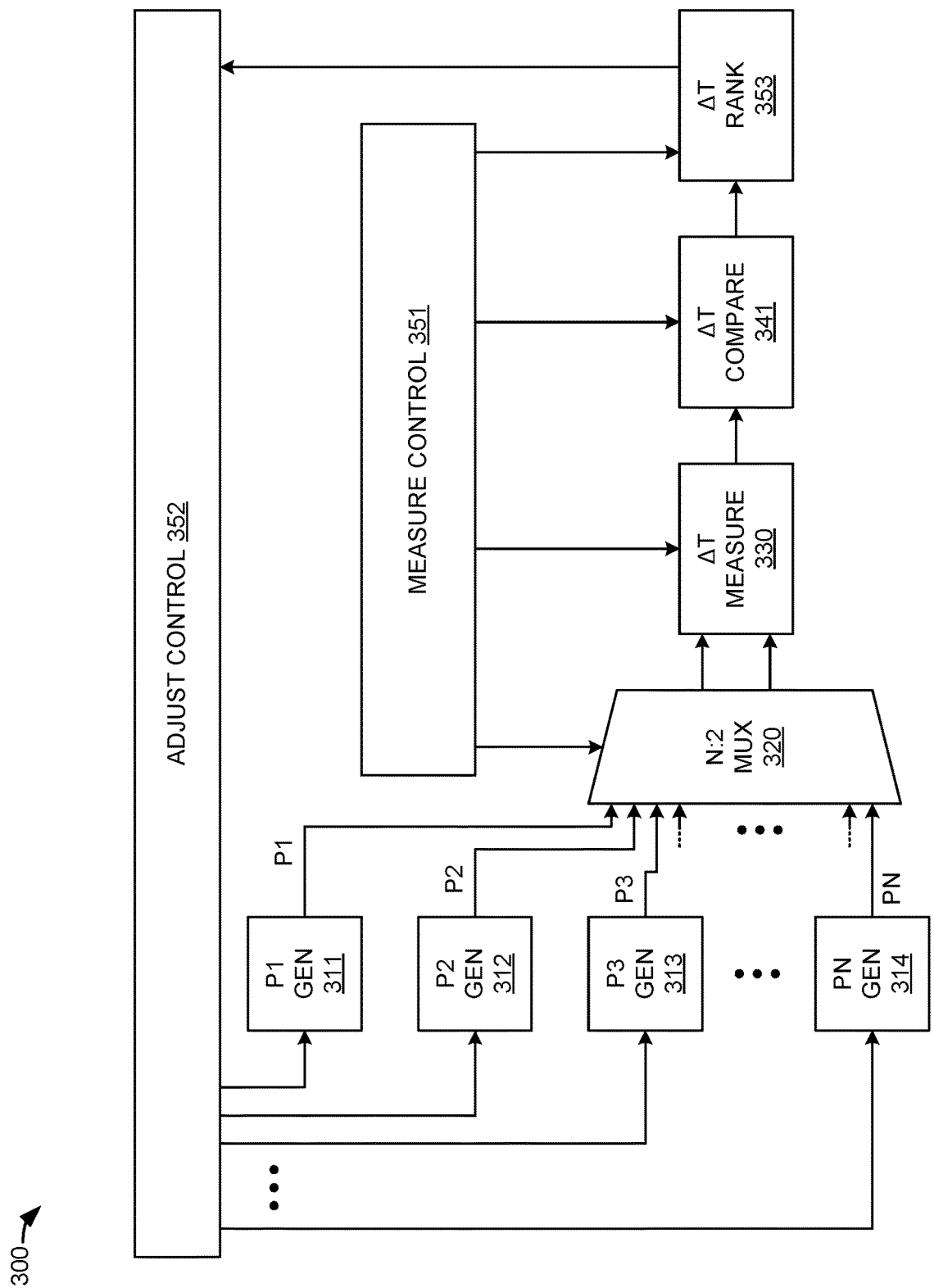
FIG. 3 is a block diagram illustrating a relative measurement multi-phase clock adjustment system.

FIG. 3 is a block diagram illustrating a relative measurement multi-phase clock adjustment system. In FIG. 3, multiphase clock adjustment system 300 comprises N number of clock phase generators 311-314, N-to-two signal (N:2) multiplexer (MUX) 320, time difference ($\Delta T$) measurement circuitry 330, time difference compare circuitry 341, time difference ranking circuitry 353, measurement control 351, and adjust control circuity 352. The outputs of clock phase generators 311-314 are operatively coupled to the inputs of N:2 MUX 320. Measurement control circuitry 351 is operative coupled to the control input(s) of N:2 MUX 320. Thus, measurement control circuitry 351 may control N:2 MUX 320 to select two of the signals generated by clock phase generators 311-314 and provide them to time difference ($\Delta T$) measurement circuitry 330.

The output of time difference measurement circuitry 330 is one or more indicators of a time difference between edges of the signals provided by N:2 MUX 320. For example, the output of time difference measurement circuitry 330 may be a voltage, current, or value that corresponds to the time difference between a first edge (e.g., rising) on the first signal from N:2 MUX 320 and a second edge (e.g., rising) on the second signal from N:2 MUX 320. In an embodiment, N:2 MUX 320 is controlled such that time difference measurement circuitry 330 measures the time difference between the rising (or falling) edges of adjacent phases.

Figure 4:
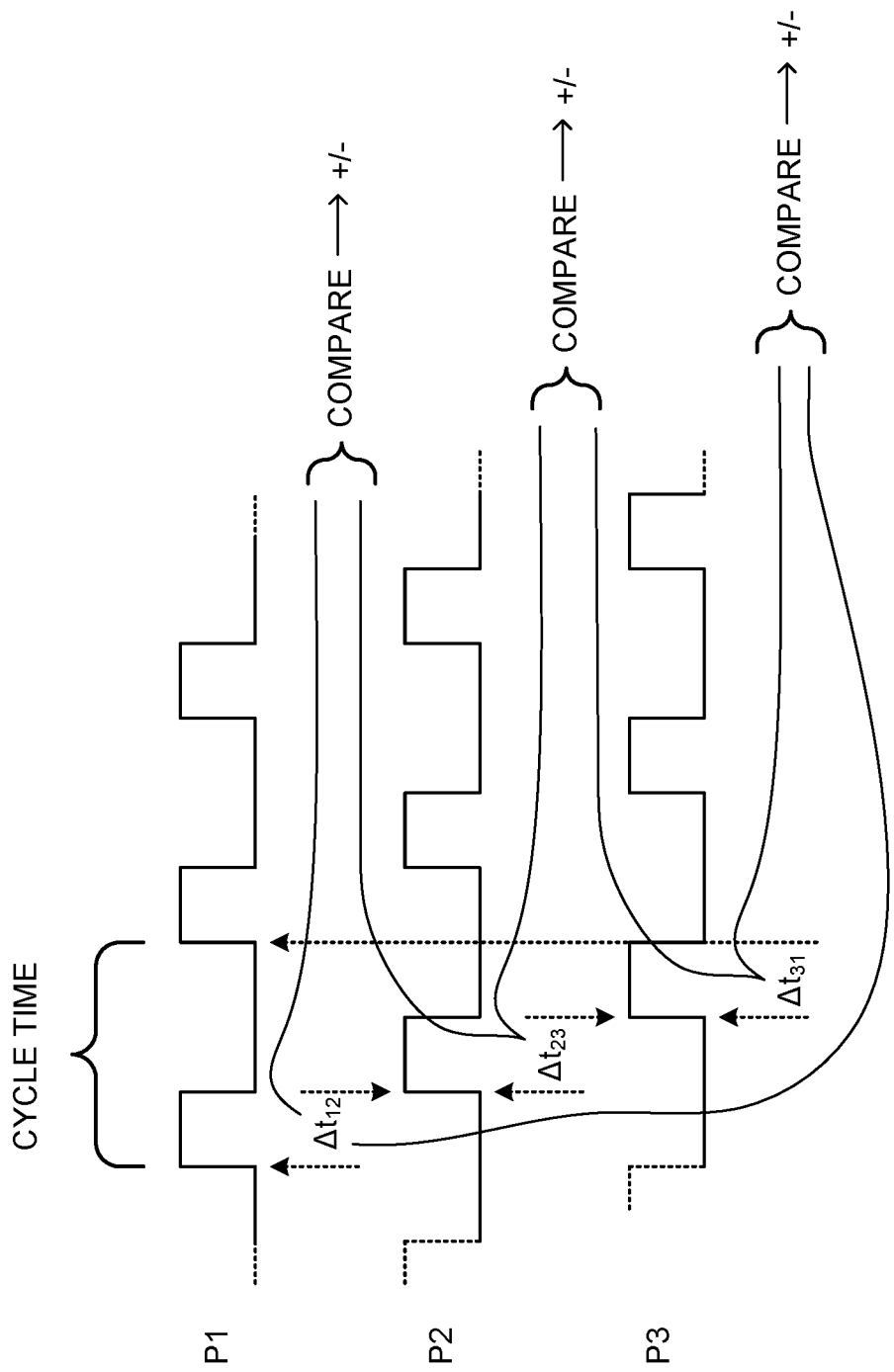
FIG. 4 is a timing diagram illustrating relative measurements for adjusting a multi-phase clock system.

Time difference compare circuitry 341 receives the time difference indicators from time difference measurement circuitry 330. Time difference compare circuitry 341 compares, under the control of measurement control circuitry 351, the time difference indicators from time difference measurement circuitry 330. This is further illustrated by way of example in FIG. 4. In FIG. 4, adjusted clock phase signals P1-P3 are illustrated. Thus, the clocking system illustrated in FIG. 4 is a 3-phase system. Phases P1-P3 each pulse once over the cycle time period. However, each of these pulses starts at a different, uniformly spaced, time during the cycle. Thus, in FIG. 4, P1 pulses high for ⅓ of a cycle time beginning at the start of a cycle; P2 pulses high for ⅓ of a cycle time beginning ⅓ of a cycle time from the start of a cycle; and, P3 pulses high for ⅓ of a cycle time beginning ⅔ of a cycle time from the start of a cycle.

To adjust phases P1-P3, system 300 uses N:2 MUX to select two (i.e., a pair of) adjacent clock phase signals at a time to be provided to time measurement circuitry 330. Time measurement circuitry 330 generates an indicator of the time difference between the pair of selected signals. This indicator is provided to time difference compare circuitry 341. This process is repeated for the other combinations of adjacent clock phase signals.

As illustrated in FIG. 4, system 300 measures the time difference between the rising edges of P1 and P2 ($\Delta t_{12}$); the time difference between the rising edges of P2 and P3 ($\Delta t_{23}$); and, the time difference between the rising edge of P3 and the rising edge of the P1 pulse in the next cycle ($\Delta t_{31}$). These time difference indicators are then each compared, by relative time difference compare circuitry 341, to the other time difference indicators that have been measured.

Time difference compare circuitry 341 compares pairs of time difference indicators to determine relative time difference indicators that correspond to which of the respective pair of time differences indicators corresponds to a greater (or lesser) measured time difference. In an embodiment, the relative time difference indicators are binary in nature. In other words, the relative time difference indicators only indicate which of the two time differences is greater than, or less than, the other—the magnitude of this difference is not conveyed. The relative difference indicators are provided to time difference ranking circuitry 353.

Time difference ranking circuitry 353 uses the relative difference indicators to construct a ranking (e.g., shortest time difference to longest, or vice versa) of the time differences between adjacent clock phase signals P1-PN. This ranking is provided to adjust control circuity 352. Adjust control circuitry 352 may use this ranking to adjust one or more timings of the clock phase signals P1-PN generated by clock phase generators 311-314.

Adjust control circuitry 352 is operative coupled to control input(s) of clock phase generators 311-314. Thus, adjust control circuitry 352 may control the timing of the rising and falling edges of the clock phase signals P1-PN generated by respective clock phase generators 311-314. Adjust control circuitry 352 may control the timing of the rising and falling edges generated by clock phase generators 311-314 to uniformly distribute the N number of clock phase signals P1-PN over the cycle time of the clock phases. Adjust control circuitry 352 may skew one or more of the clock phase signals P1-PN generated by clock phase generators 311-314 to obtain a desired nonuniform distribution of the clock phase signals P1-PN generated by clock phase generators 311-314.

In an embodiment, adjust control circuitry 352 may adjust, based on the ranking received from time difference ranking circuitry 353, the timing of the clock phase signals P1-PN generated by clock phase generators 311-314 to uniformly distribute the N number of clock signals over the entire clock period of the clock phase signals P1-PN. In other words, adjust control circuitry 352 may adjust the spacing (i.e., the phase angle of selected edges of adjacent clock phase signals P1-PN) and/or the pulse width of the clock phase signals P1-PN generated by clock phase generators 311-314, based on the ranking received from time difference ranking circuitry 353, such that the rising (or falling) edges of adjacent phases (e.g., phase P1 rising edge to phase P2 rising edge, phase P2 rising edge to phase P3 rising edge, etc.) are the same (or substantially the same).

Figure 5:
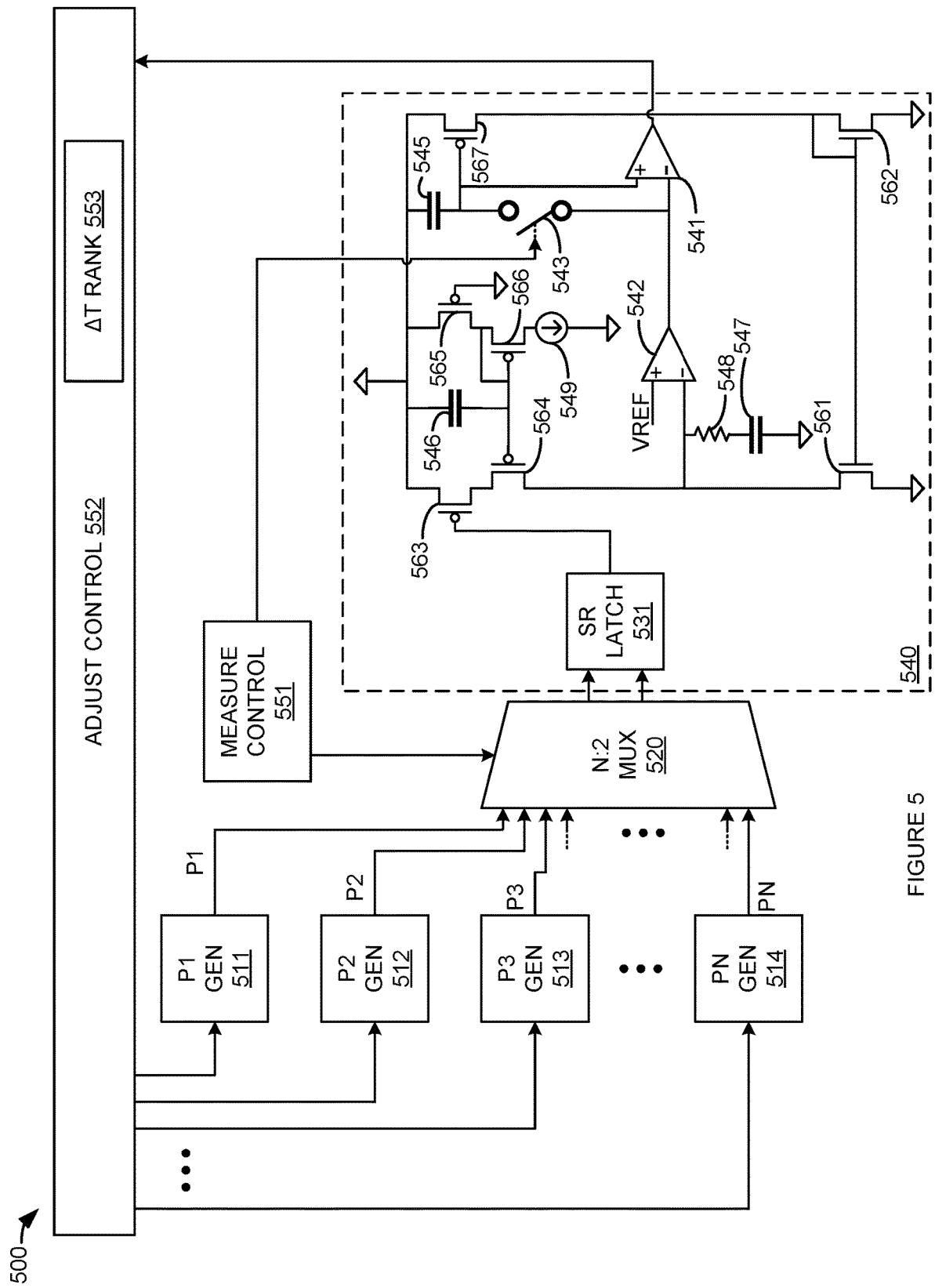
FIG. 5 is a block diagram illustrating a system for relative time delay measurement and adjustment of a multi-phase clock adjustment system.

FIG. 5 is a block diagram illustrating a system for relative time delay measurement and adjustment of a multi-phase clock adjustment system. In FIG. 5, multiphase clock adjustment system 500 comprises N number of clock phase generators 511-514, N-to-two signal (N:2) multiplexer (MUX) 520, time difference measurement and compare circuitry 540, time measurement control 551, and adjust control circuitry 552. Adjust control circuitry 552 includes time difference ranking circuitry 553. Time difference measurement and compare circuitry 540 both generates the indicators of time differences in the signals P1-PN from MUX 520 and compares those differences to produce relative time difference indicators that are provided to adjust control circuitry 552. Thus, multiphase clock adjustment system 500 is similar to multiphase clock adjustment system 300 with the functions of time difference measurement 330 and relative time difference compare 341 being combined and performed by time difference measurement and compare circuitry 540, and the relative time difference ranking 353 being performed by adjust control circuitry 552.

Time difference measurement and compare circuitry 540 comprises set-reset (SR) latch 531, amplifiers 541-542, sample-switch 543, capacitors 545-547, resistor 548, bias current source 549, n-channel field effect transistors (NFETs) 561-562, and p-channel field effect transistors (PFETs) 563-567. In FIG. 5, the source of PFET 565 is connected to the positive supply voltage. The gate of PFET 565 is connected to the negative supply voltage. The drain of PFET 565 is connected to the source of PFET 566. The gate of PFET 566 is connected to the drain of PFET 566, the gate of PFET 564, and a first terminal of capacitor 546. The second terminal of capacitor 546 is connected to a supply voltage. The drain of PFET 566 is connected to a first terminal of bias current source 549. The second terminal of bias current source 549 is connected to the negative supply voltage.

The source of PFET 563 is connected to the positive supply voltage. The gate of PFET 563 is connected to the output of SR latch 531. The drain of PFET 563 is connected to the source of PFET 564. The drain of PFET 564 is connected to the drain of NFET 561, the inverting input of amplifier 542, and a first terminal of resistor 548. From the foregoing, it should be understood that PFETs 563-566, capacitor 546, and bias current source 549 form a switched current mirror. This switched current mirror is under the control of SR latch 531. When the output of SR latch 531 is low, the switched current mirror provides a current substantially equal to bias current source 549 to the drain node of NFET 561. When the output of SR latch 531 is high, substantially no current is provided to the drain node of NFET 561.

The non-inverting input of amplifier 542 is connected to a reference voltage (VREF). A second terminal of resistor 548 is connected to a first terminal of capacitor 547. The second terminal of capacitor 547 is connected to the negative supply voltage. The output of amplifier 542 is provided to the inverting input of amplifier 541 and a first terminal of sample-switch 543. Sample switch 543 is controlled by measurement control 551. The second terminal of sample-switch 543 is connected to a first terminal of capacitor 545, the gate of PFET 567, and the non-inverting input of amplifier 541.

The source of PFET 567 is connected to the positive supply voltage. The drain of PFET 567 is connected to the drain and gate of NFET 562 (i.e., a 'diode' configuration), and the gate of NFET 561. The sources of NFETs 561-562 are connected to the negative supply voltage. Thus, it should be understood that NFETs 561-562 form a 'current mirror' configuration that substantially duplicates the current flowing through PFET 567 with a current flowing into the drain of NFET 561.

In operation, measurement control 551 selects a first pair of adjacent clock phase signals P1-PN using N:2 MUX 520. A first rising edge on a first signal of this pair sets the output of SR latch 531 to turn PFET 563 on thereby causing a duplicated bias current to flow out of PFET 564. A second rising edge on the second signal of this pair resets the output of SR latch 531 to turn off the duplicated bias current flow. The voltage at the inverting input node of amplifier 542 is filtered by an RC filter comprised of resistor 548 and capacitor 547. The output of amplifier 542 is therefore an integration of the difference in the voltage on the non-inverting input to amplifier 542 and the reference voltage VREF.

The output of amplifier 542 is sampled by closing sample-switch 543 to charge capacitor 545 and then opening sample-switch 543 to hold the voltage on capacitor 545 across the gate and source nodes of PFET 567 (and also hold this voltage on the non-inverting input to amplifier 541.) Holding the voltage on capacitor 545 across the gate and source nodes of PFET 567 causes an average of the current flowing through PFET 564 to be replicated by the current mirror comprised of NFETs 561-562. Amplifier 541 compares the held voltage on capacitor 545 to a new voltage output by amplifier 542 from the next time delay measurement.

It should be understood therefore, that in general terms, SR latch 531 and the switched current mirror convert the phase difference between the two signals received from N:2 MUX 520 into a current. The currents from this conversion and the current from a different conversion are then compared using a sample-and-hold configuration (via capacitor 545 and PFET 567) to determine a relative (i.e., which is greater than the other) comparison. By generating relative comparisons for each combination of pairs of adjacent clock phase signals P1-PN, time difference ranking circuitry 553 can produce a ranking of the time differences. Base on this ranking, adjust control circuitry 552 adjusts the timing of one or more of clock phase signals P1-PN.

For example, for a four clock phase system (e.g., clock phase signals P1, P2, P3, and P4), measurement control 540 may control MUX 520 and compare circuitry 540 to make the following relative comparisons: (1) the P1 to P2 is time difference is compared to the P2 to P3 time difference; (2) the P1 to P2 is time difference is compared to the P3 to P4 time difference; (3) the P1 to P2 is time difference is compared to the P4 to P1 time difference; (4) the P2 to P3 is time difference is compared to the P3 to P4 time difference; (5) the P2 to P3 is time difference is compared to the P4 to P1 time difference; and, (6) the P3 to P4 is time difference is compared to the P4 to P1 time difference. From the results of these comparisons, adjust control circuitry 552 (and time difference ranking circuitry 553, in particular) can produce a ranking of the time differences. For example, ranking circuitry 553 may determine that the P2 to P3 is less than the P3 to P4 delay, which is less than the P4 to P1 delay, which is less than the P1 to P2 delay. Based on this ranking, adjust control circuitry 552 may adjust a timing of at least one of P1-P4 as generated by clock phase generators 511-514.

Figure 6:
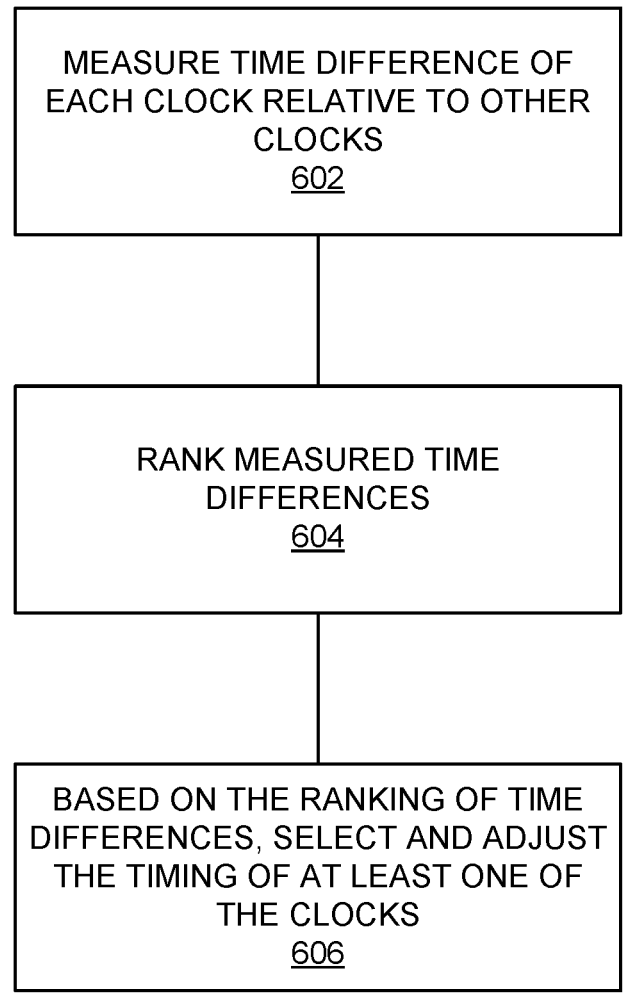
FIG. 6 is a flowchart illustrating a method of adjusting a timing of a clock in a multi-phase clock system.

FIG. 6 is a flowchart illustrating a method of adjusting a timing of a clock in a multi-phase clock system. The steps illustrated in FIG. 6 may be performed by one or more elements of multiphase clock adjustment system 100, system 300, and/or system 500. The time difference of each clock is measured relative to other clocks (602). For example, for a four clock phase system (e.g., clock phase signals P1, P2, P3, and P4), measurement control 540 may control MUX 520 and compare circuitry 540 to make the following relative comparisons: (1) the P1 to P2 is time difference is compared to the P2 to P3 time difference; (2) the P1 to P2 is time difference is compared to the P3 to P4 time difference; (3) the P1 to P2 is time difference is compared to the P4 to P1 time difference; (4) the P2 to P3 is time difference is compared to the P3 to P4 time difference; (5) the P2 to P3 is time difference is compared to the P4 to P1 time difference; and, (6) the P3 to P4 is time difference is compared to the P4 to P1 time difference.

The measured time differences are ranked (604). For example, based on the relative measurements made in box 602, ranking circuitry 553 may determine that the P2 to P3 is less than the P3 to P4 delay, which is less than the P4 to P1 delay, which is less than the P1 to P2 delay. Based on the ranking of time differences, the timing of at least one of the clocks is selected and adjusted (606). For example, because the P2 to P3 delay is the shortest, and the P1 to P2 delay is the longest, adjust control circuitry 552 may adjust a timing of at least one of P1-P4 (e.g., decrease P1 high time) as generated by clock phase generators 511-514.

Figure 7:
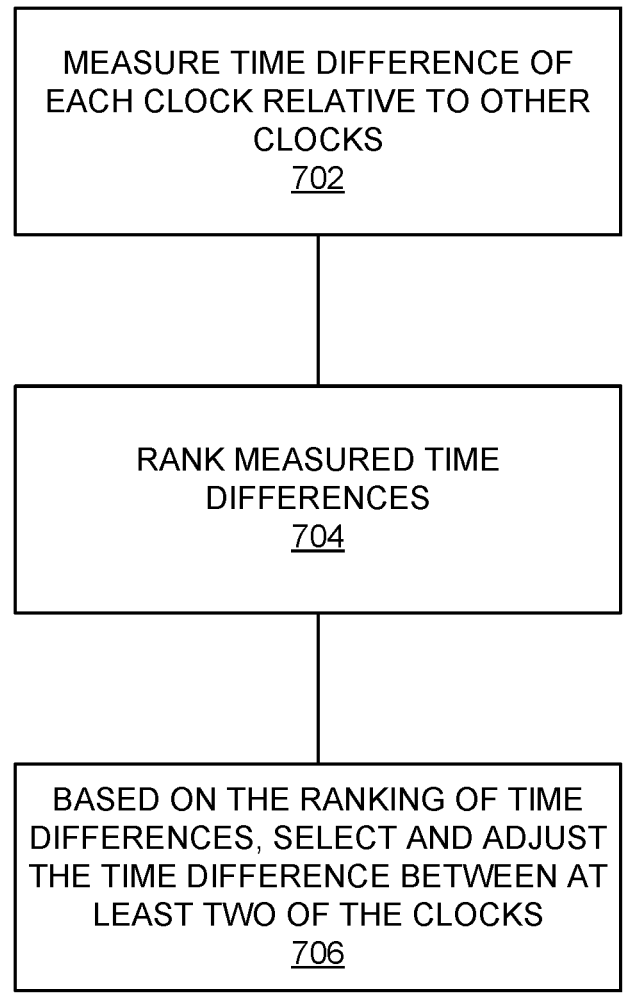
FIG. 7 is a flowchart illustrating a method of adjusting a relative time difference between clocks in a multi-phase clock system.

FIG. 7 is a flowchart illustrating a method of adjusting a relative time difference between clocks in a multi-phase clock system. The steps illustrated in FIG. 7 may be performed by one or more elements of multiphase clock adjustment system 100, system 300, and/or system 500. The time difference of each clock is measured relative to other clocks (702). For example, for a three clock phase system (e.g., clock phase signals P1, P2, and P3), measurement control 540 may control MUX 520 and compare circuitry 540 to make the following relative comparisons: (1) the P1 to P2 is time difference is compared to the P2 to P3 time difference; (2) the P1 to P2 is time difference is compared to the P3 to P1 time difference; and, (3) the P2 to P3 is time difference is compared to the P3 to P1 time difference.

The measured time differences are ranked (704). For example, based on the relative measurements made in box 702, ranking circuitry 553 may determine that the P2 to P3 is less than the P1 to P2 delay, which is less than the P3 to P1 delay. Based on the ranking of time differences, the time difference between at least two of the clocks is selected and adjusted (706). For example, because the P2 to P3 delay is the shortest, and the P1 to P2 delay is the longest, adjust control circuitry 552 may reduce the delay between P1 and P2 (and/or increase the delay between P2 and P3) as generated by clock phase generators 511-514.

Figure 8:
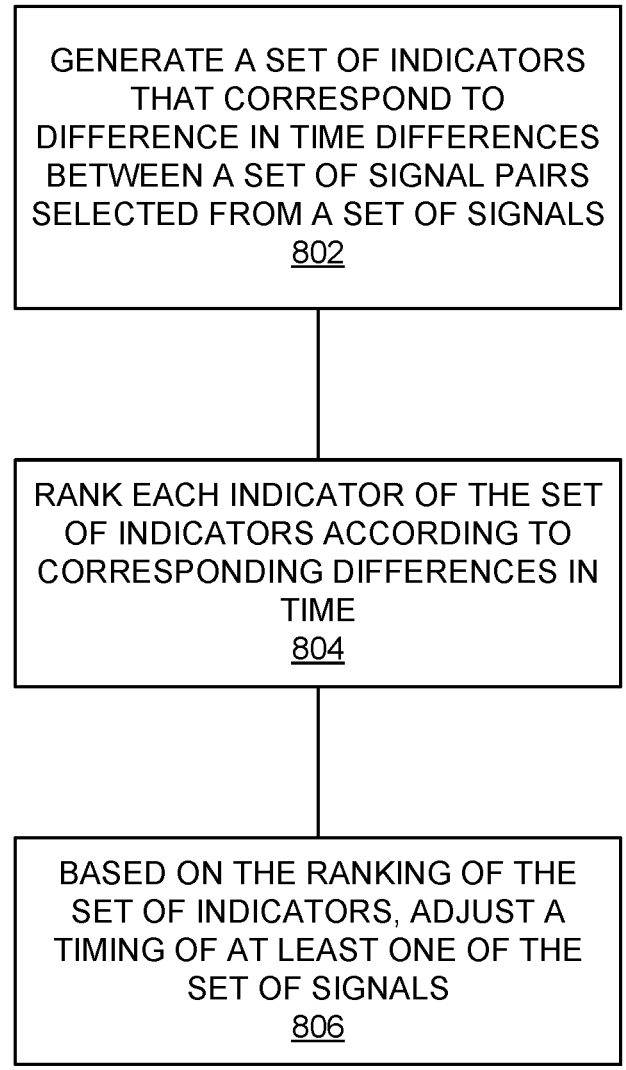
FIG. 8 is a flowchart illustrating a method that uses differences in time differences to adjust a timing of a clock in a multi-phase clock system.

FIG. 8 is a flowchart illustrating a method of adjusting a timing of a clock in a multi-phase clock system. The steps illustrated in FIG. 8 may be performed by one or more elements of multiphase clock adjustment system 100, system 300, and/or system 500. A set of indicators that correspond to difference in time differences between a set of signal pairs selected from a set of signals is generated (802). For example, For example, for a four clock phase system (e.g., clock phase signals P1, P2, P3, and P4), measurement control 540 may control MUX 520 and compare circuitry 540 to produce and indicator (e.g., a '1' for the first time difference being greater than the second time difference, and a '0', or vice versa) for each of the set of relative comparisons: (1) the P1 to P2 is time difference is compared to the P2 to P3 time difference; (2) the P1 to P2 is time difference is compared to the P3 to P4 time difference; (3) the P1 to P2 is time difference is compared to the P4 to P1 time difference; (4) the P2 to P3 is time difference is compared to the P3 to P4 time difference; (5) the P2 to P3 is time difference is compared to the P4 to P1 time difference; and, (6) the P3 to P4 is time difference is compared to the P4 to P1 time difference.

Each difference in time is ranked based on the set of indicators (804). For example, based on the indicators from compare circuitry 540, ranking circuitry 553 may determine that the P2 to P3 is less than the P3 to P4 delay, which is less than the P4 to P1 delay, which is less than the P1 to P2 delay. Based on the ranking, a timing of at least one of the set of signals is adjusted (806). For example, because the P2 to P3 delay is the shortest, and the P1 to P2 delay is the longest, adjust control circuitry 552 may adjust a timing of at least one of P1-P4 (e.g., decrease P1 high time) as generated by clock phase generators 511-514.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of multiphase clock adjustment system 100, system 300, and/or system 500, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 9:
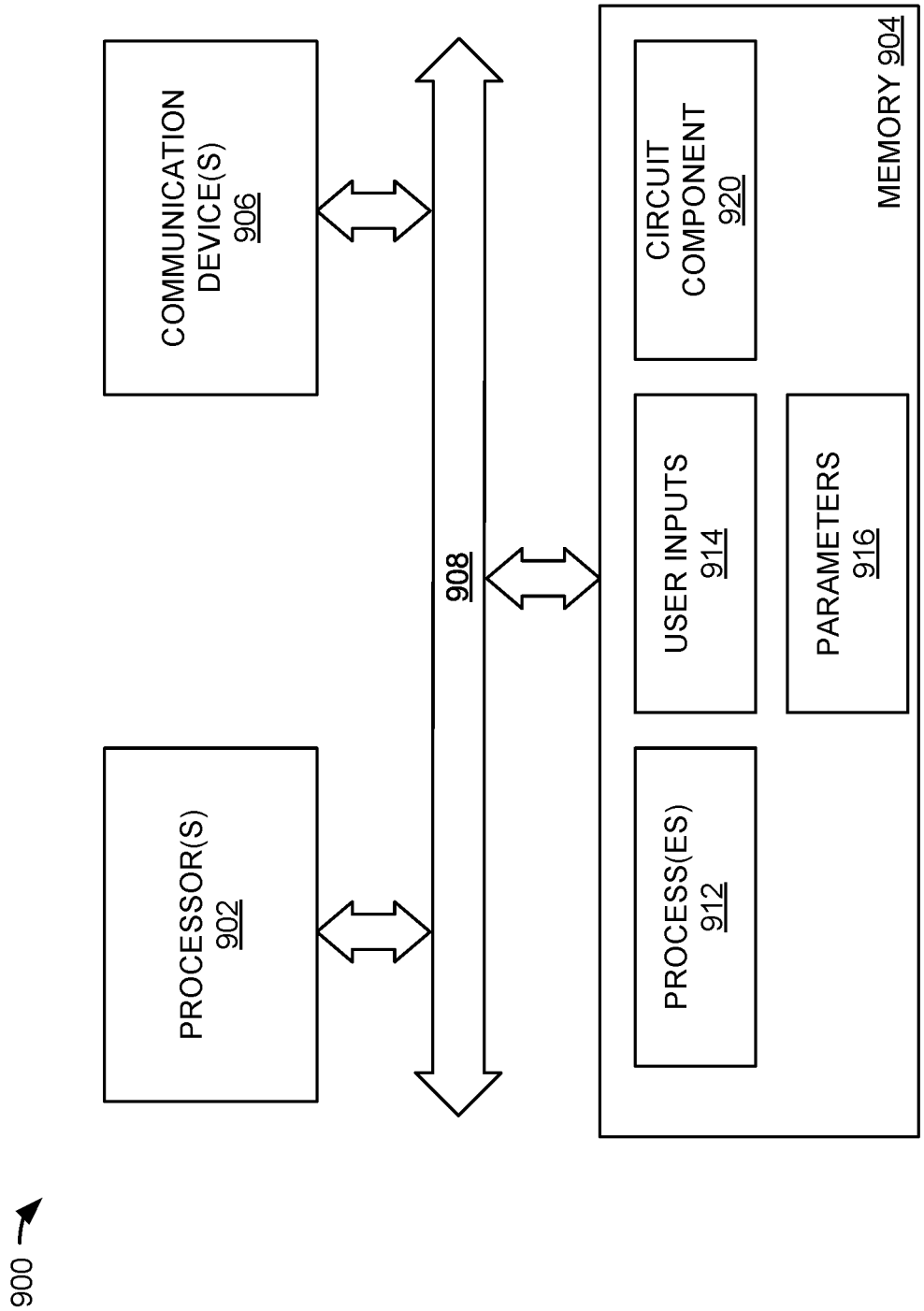
FIG. 9 is a block diagram of a processing system.

FIG. 9 is a block diagram illustrating one embodiment of a processing system 900 for including, processing, or generating, a representation of a circuit component 920. Processing system 900 includes one or more processors 902, a memory 904, and one or more communications devices 906. Processors 902, memory 904, and communications devices 906 communicate using any suitable type, number, and/or configuration of wired and/or wireless connections 908.

Processors 902 execute instructions of one or more processes 912 stored in a memory 904 to process and/or generate circuit component 920 responsive to user inputs 914 and parameters 916. Processes 912 may be any suitable electronic design automation (EDA) tool or portion thereof used to design, simulate, analyze, and/or verify electronic circuitry and/or generate photomasks for electronic circuitry. Representation 920 includes data that describes all or portions of multiphase clock adjustment system 100, system 300, and/or system 500, and their components, as shown in the Figures.

Representation 920 may include one or more of behavioral, register transfer, logic component, transistor, and layout geometry-level descriptions. Moreover, representation 920 may be stored on storage media or communicated by carrier waves.

Data formats in which representation 920 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 914 may comprise input parameters from a keyboard, mouse, voice recognition interface, microphone and speakers, graphical display, touch screen, or other type of user interface device. This user interface may be distributed among multiple interface devices. Parameters 916 may include specifications and/or characteristics that are input to help define representation 920. For example, parameters 916 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 904 includes any suitable type, number, and/or configuration of non-transitory computer-readable storage media that stores processes 912, user inputs 914, parameters 916, and circuit component 920.

Communications devices 906 include any suitable type, number, and/or configuration of wired and/or wireless devices that transmit information from processing system 900 to another processing or storage system (not shown) and/or receive information from another processing or storage system (not shown). For example, communications devices 906 may transmit circuit component 920 to another system. Communications devices 906 may receive processes 912, user inputs 914, parameters 916, and/or circuit component 920 and cause processes 912, user inputs 914, parameters 916, and/or circuit component 920 to be stored in memory 904.

The foregoing description has been presented for purposes of illustration and description. It is not intended to be exhaustive or to limit the claims to the precise form below, and other modifications and variations may be possible in light of the above teachings. The embodiments were chosen and described in order to best explain the principles and their practical application to thereby enable others skilled in the art to best utilize the teachings in various embodiments and various modifications as are suited to the particular use contemplated.

What is claimed is:

1. An integrated circuit, comprising:
    first circuitry to output a first timing reference signal;
    second circuitry to output a second timing reference signal;
    third circuitry to output a third timing reference signal;
    relative timing difference circuitry to produce a first relative difference indicator based on a first timing between the first timing reference signal and the second timing reference signal, and to produce a second relative difference indicator based on a second timing between the second timing reference signal and the third timing reference signal, and to produce a third relative difference indicator based on a third timing between the third timing reference signal and the first timing reference signal; and
    timing adjustment circuitry, coupled to the first circuitry, the second circuitry, and the third circuitry, to adjust, based on a rank of the first relative difference indicator, the second relative difference indicator, and the third relative difference indicator, adjust a timing of at least one of the first timing reference signal, the second timing reference signal, and the third timing reference signal.

2. The integrated circuit of claim 1, wherein the first relative difference indicator, the second relative difference indicator, and the third relative difference indicator correspond to whether respective time differences between respective pairs of signals is greater than, or less than, each other.

3. The integrated circuit of claim 2, further comprising:
    timing difference ranker circuitry to sort the first timing, the second timing, and the third timing according to magnitudes as indicated by the first relative difference indicator, the second relative difference indicator, and the third relative difference indicator.

4. The integrated circuit of claim 3, further comprising:
    a hold circuit to temporarily hold the first relative difference indicator, the second relative difference indicator, and the third relative difference indicator.

5. The integrated circuit of claim 4, wherein the timing difference ranker circuitry compares a held version of the first relative difference indicator to the second relative difference indicator, and compares a held version of the second relative difference indicator to the third relative difference indicator, and compares a held version of the third relative difference indicator to the first relative difference indicator.

6. The integrated circuit of claim 5, wherein the hold circuit includes an analog sample-and-hold circuit.

7. The integrated circuit of claim 1, further comprising:
    a multiplexer circuit to provide the first timing reference signal, the second timing reference signal, and the third timing reference signal to relative timing difference circuitry.

8. The integrated circuit of claim 7, wherein the multiplexer circuit concurrently provides at least two of the first timing reference signal, the second timing reference signal, and the third timing reference signal to relative timing difference circuitry.

9. An integrated circuit, comprising:
    first circuitry to output a first timing reference signal;
    second circuitry to output a second timing reference signal;
    third circuitry to output a third timing reference signal;
    time difference measurement circuitry to generate a set of at least three indicators that correspond to differences in time differences between pairs of the first timing reference signal, the second timing reference signal, and the third timing reference signal; and
    adjustment circuitry coupled to the first circuitry, the second circuitry, and the third circuitry to, based on the set of at least three indicators, adjust a timing difference between, at least the first timing reference signal and the second timing reference signal.

10. The integrated circuit of claim 9, wherein each of the set of at least three indicators is associated with respective pairs of the first timing reference signal, the second timing reference signal, and the third timing reference signal, and each of the set of at least three indicators correspond to whether a first time difference between signals of a first one of a respective signal pair is greater than, or less, than a second time difference between signals of a second signal pair.

11. The integrated circuit of claim 10, wherein the adjustment circuitry is to sort respective signal pairs according to the differences in time differences between pairs of the first timing reference signal, the second timing reference signal, and the third timing reference signal.

12. The integrated circuit of claim 9, wherein the time difference measurement circuitry comprises:
time difference capture circuitry to generate a first indicator of a time difference between a first pair of signals and to generate a second indicator of a time difference between a second pair of signals; and
time difference compare circuitry to generate a relative difference indicator that corresponds to whether of the first indicator is associated with a one of a greater or lesser time difference than the second indicator.

13. The integrated circuit of claim 12, wherein the time difference measurement circuitry further comprises:
time difference indicator storage circuitry to hold the first indicator while the second indicator is generated and to provide the first indicator to the time difference compare circuitry.

14. The integrated circuit of claim 13, wherein the time difference indicator storage circuitry includes a sample-and-hold circuit.

15. The integrated circuit of claim 14, further comprising:
a multiplexer circuit to select a first pair of signals; and
a time difference indicator circuit to provide a first pulse corresponding to the time difference between the first pair of signals to the time difference capture circuitry.

16. A method of operating an integrated circuit, comprising:
generating a set of at least three indicators that correspond to relative differences in time differences between a set of at least three signal pairs selected from a set of signals that includes at least three signals;
ranking each of the time differences between each of the set of at least three signal pairs based on the set of at least three indicators; and
based on the ranking, adjusting a timing of at least one of the set of signals.

17. The method of claim 16, wherein generating the set of at least three indicators further comprises:
storing a version of a first indicator;
generating a second indicator of a second time difference between a third signal and a fourth signal of a second signal pair; and
comparing the version of the first indicator to the second indicator to produce one of the set of at least three indicators.

18. The method of claim 17, wherein each of the set of at least three indicators corresponds to which signal pair of a pair of signal pairs has a greater time difference between members of said signal pair.

19. The method of claim 16, wherein generating the set of at least three indicators further comprises:
generating a first indicator of a first time difference between a first signal and a second signal of a first signal pair.

20. The method of claim 18, wherein generating the set of at least three indicators further comprises:
generating a second indicator of a second time difference between a third signal and a fourth signal of a second signal pair; and
comparing the first indicator to the second indicator to produce one of the set of at least three indicators.

* * * * *